(12) United States Patent
Chu

(10) Patent No.: US 8,386,905 B2
(45) Date of Patent: Feb. 26, 2013

(54) ERROR CORRECTING METHOD, AND MEMORY CONTROLLER AND MEMORY STORAGE SYSTEM USING THE SAME

(75) Inventor: Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 333 days.

(21) Appl. No.: 12/785,729

(22) Filed: May 24, 2010

(65) Prior Publication Data

US 2011/0231732 A1    Sep. 22, 2011

(30) Foreign Application Priority Data

Mar. 22, 2010  (TW) .............................. 99108358 A

(51) Int. Cl.
*G06F 11/00*    (2006.01)
(52) U.S. Cl. .................... 714/801; 714/758; 714/764
(58) Field of Classification Search .................. 714/801, 714/758, 773, 763, 768, 719, 764, 2
See application file for complete search history.

(56) References Cited

U.S. PATENT DOCUMENTS

| | | | |
|---|---|---|---|
| 7,793,192 B2* | 9/2010 | Tamura et al. | 714/763 |
| 8,006,030 B2* | 8/2011 | Nakamura et al. | 711/103 |
| 2006/0039196 A1* | 2/2006 | Gorobets et al. | 365/185.01 |
| 2009/0287956 A1* | 11/2009 | Flynn et al. | 714/6 |
| 2010/0293430 A1* | 11/2010 | Lin et al. | 714/752 |
| 2010/0293439 A1* | 11/2010 | Flynn et al. | 714/763 |

* cited by examiner

*Primary Examiner* — Fritz Alphonse
(74) *Attorney, Agent, or Firm* — J.C. Patents

(57) ABSTRACT

An error correcting method for a memory chip is provided. The memory chip has a plurality of physical blocks, each of the physical blocks has a plurality of physical pages, and the physical pages belonging to the same physical block are individually written and simultaneously erased. The error correcting method includes sequentially writing a plurality of data into the physical pages of a first physical block and generating a parity information according to the data. The error correcting method further includes writing the parity information into one of the physical pages of the first physical block following the data and correcting the data in the first physical block according to the parity information. Accordingly, the parity information can be used for correcting error bits in the data when an error checking and correcting circuit can not correct the error bits. Thereby, the error correcting ability is enhanced.

24 Claims, 15 Drawing Sheets

| 0 | 1010 |
| 1 | 1011 |
| 2 | 1100 |
| 3 | 0101 |
| 4 | 0011 |
| 5 | 1011 |

304(D+1)

|   | EFG1 | EFG2 | EFG3 | EFG4 |
|---|------|------|------|------|
| 0 | EF1  | EF2  | EF3  | EF4  |
| 1 | EF5  | EF6  | EF7  | EF8  |
| 2 | EF9  | EF10 | EF11 | EF12 |
| 3 | EF13 | EF14 | EF15 | EF16 |
| 4 | EF17 | EF18 | EF19 | EF20 |
| 5 | GPI1 | GPI2 | GPI3 | GPI4 |

ERROR CORRECTING METHOD, AND MEMORY CONTROLLER AND MEMORY STORAGE SYSTEM USING THE SAME

CROSS-REFERENCE TO RELATED APPLICATION

This application claims the priority benefit of Taiwan application serial no. 99108358, filed on Mar. 22, 2010. The entirety of the above-mentioned patent application is hereby incorporated by reference herein and made a part of this specification.

BACKGROUND

1. Technology Field

The present invention relates to an error correcting method for correcting data stored in a rewritable non-volatile memory, and a memory controller and a memory storage system using the same.

2. Description of Related Art

Along with the widespread of digital cameras, cell phones, and MP3 in recently years, the consumers' demand to storage media has increased drastically. Rewritable non-volatile memory is one of the most adaptable memories for such battery-powered portable products due to its characteristics such as data non-volatility, low power consumption, small volume, and non-mechanical structure. A solid state drive (SSD) is a storage device which uses a rewritable non-volatile memory as its storage medium. Rewritable non-volatile memory has been broadly used for storing important personal data thanks to its small volume and large capacity. Thereby, the rewritable non-volatile memory industry has become a very important part of the electronic industry in recent years.

Because error bits may occur in the data stored in a rewritable non-volatile memory due to various factors (for example, memory cell leakages, program failures, and damages, etc), an error checking and correcting (ECC) circuit is usually configured in a memory storage system and an ECC code is generated for the stored data to ensure the accuracy of the data. However, data containing error bits cannot be corrected if the number of the error bits in the data is larger than the number of error bits that can be detected and corrected by the ECC circuit. As a result, data loss may be caused. Thereby, how to correct error bits, that cannot be corrected based on an ECC code, is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to an error correcting method that can effectively enhance the error correcting ability.

The present invention is also directed to a memory controller that can effectively enhance the error correcting ability.

The present invention is further directed to a memory storage apparatus that can effectively enhance the error correcting ability.

According to an exemplary embodiment of the present invention, an error correcting method for a memory chip is provided. The memory chip has a plurality of physical blocks, each of the physical blocks has a plurality of physical pages, and the physical pages belonging to the same physical block can be individually written and must be simultaneously erased. The error correcting method includes generating a plurality of error checking and correcting (ECC) codes corresponding to a plurality of data, sequentially writing the data and the corresponding ECC codes into the physical pages of a first physical block, and generating a first parity information according to the data. The error correcting method also includes writing the first parity information into one of the physical pages of the first physical block following the data. The error correcting method further includes correcting the data by using the corresponding ECC codes; and correcting the data in the first physical block according to the first parity information when the data cannot be corrected by using the corresponding ECC codes.

According to an exemplary embodiment of the present invention, a memory controller for managing a memory chip is provided. The memory chip has a plurality of physical blocks, each of the physical blocks has a plurality of physical pages, and the physical pages belonging to the same physical block can be individually written and must be simultaneously erased. The memory controller includes a host interface, a memory interface, and a memory management circuit. The host interface is configured for coupling to a host system, and the memory interface is configured for coupling to the memory chip. The memory management circuit is coupled to the host interface and the memory interface and executes the error correcting method described above.

According to an exemplary embodiment of the present invention, a memory storage system including a connector, a memory chip, and a memory controller is provided. The memory chip has a plurality of physical blocks, each of the physical blocks has a plurality of physical pages, and the physical pages belonging to the same physical block can be individually written and must be simultaneously erased. The memory controller is coupled to the memory chip and the connector and executes the error correcting method described above.

As described above, the error correcting method, the memory controller, and the memory storage apparatus in exemplary embodiments of the present invention can effectively enhance the error correcting ability.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 17 is a diagram illustrating the generation and storage of sub parity information according to a fourth exemplary embodiment of the present invention.

DESCRIPTION OF THE EMBODIMENTS

Figure 1A:
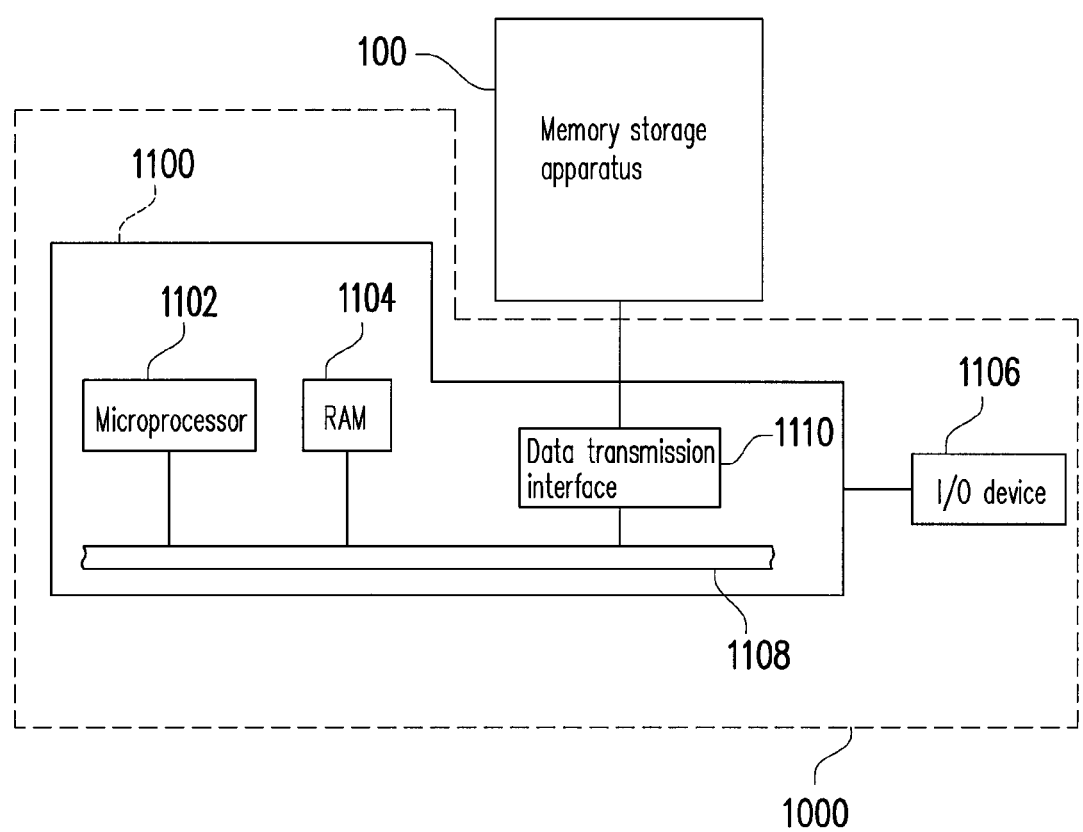
FIG. 1A is a schematic block diagram of a host system using a memory storage apparatus according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage apparatus (also referred to as a memory storage system) includes a memory chip and a controller (also referred to as a control circuit). A memory storage apparatus is usually used together with a host system so that the host system can write data into or read data from the memory storage apparatus. In addition, a memory storage apparatus may also include an embedded memory and a software that can be executed on the host system and substantially served as a controller of the embedded memory.

First Exemplary Embodiment

FIG. 1A is a schematic block diagram of a host system and a memory storage apparatus according to the first exemplary embodiment of the present invention.

Figure 1B:
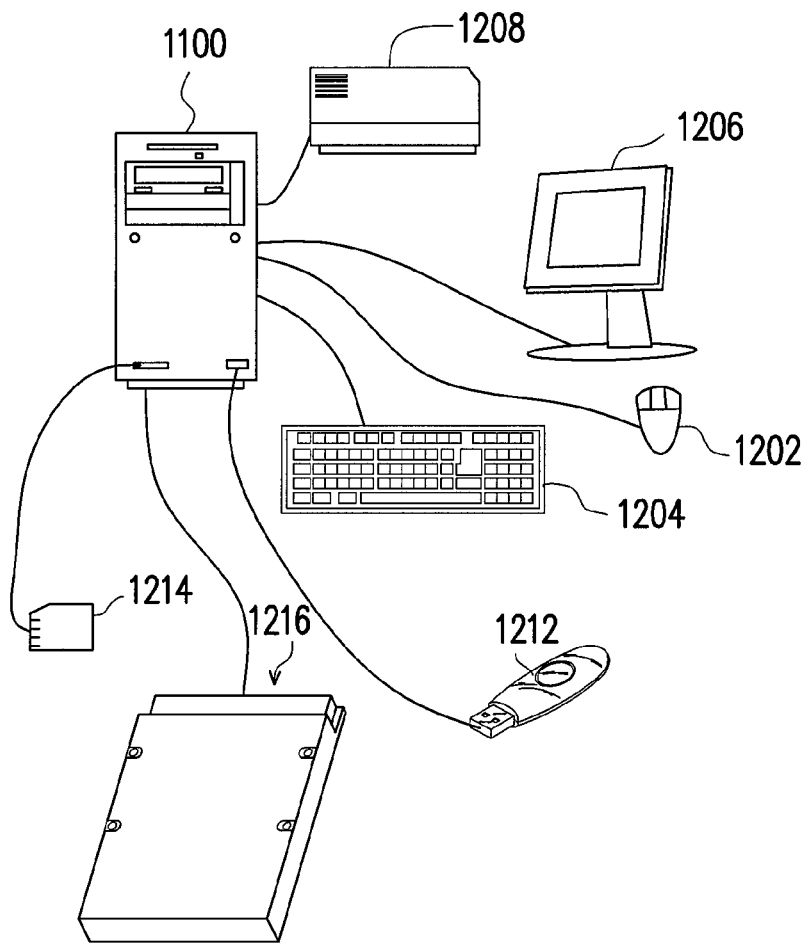
FIG. 1B is a diagram of a host system and a memory storage apparatus according to another exemplary embodiment of the present invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B, and which may further include other devices.

In the present exemplary embodiment, a memory storage apparatus 100 is coupled to other components of the host system 1000 through the data transmission interface 1110. Data can be written into or read from the memory storage apparatus 100 through the operations of the microprocessor 1102, the RAM 1104, and the I/O device 1106. For example, the memory storage apparatus 100 may be a flash drive 1212, a memory card 1214, or a solid state drive (SSD) 1216, as shown in FIG. 1B.

Figure 1C:
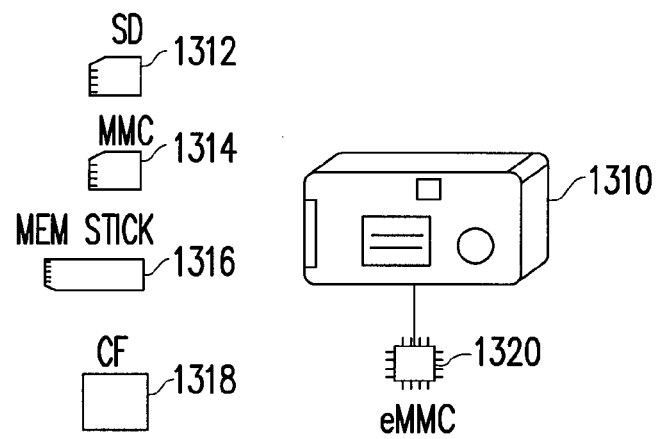
FIG. 1C is a diagram of a host system and a memory storage apparatus according to another exemplary embodiment of the present invention.

Generally speaking, the host system 1000 may be any system that can store data. Even though the host system 1000 is described as a computer system in the present exemplary embodiment, the host system 1000 may also be a digital camera, a video camera, a communication device, an audio player, or a video player in another exemplary embodiment of the present invention. For example, if the host system is a digital camera (or a video camera) 1310, the memory storage apparatus is then a SD card 1312, a multi media card 1314, a memory stick 1316, a CF card 1318, or an embedded storage device 1320 (as shown in FIG. 1C) used along with the digital camera 1310. The embedded storage device 1320 includes embedded MMC (eMMC). It should be mentioned that the eMMC is directly coupled to the substrate of the host system.

Figure 2:
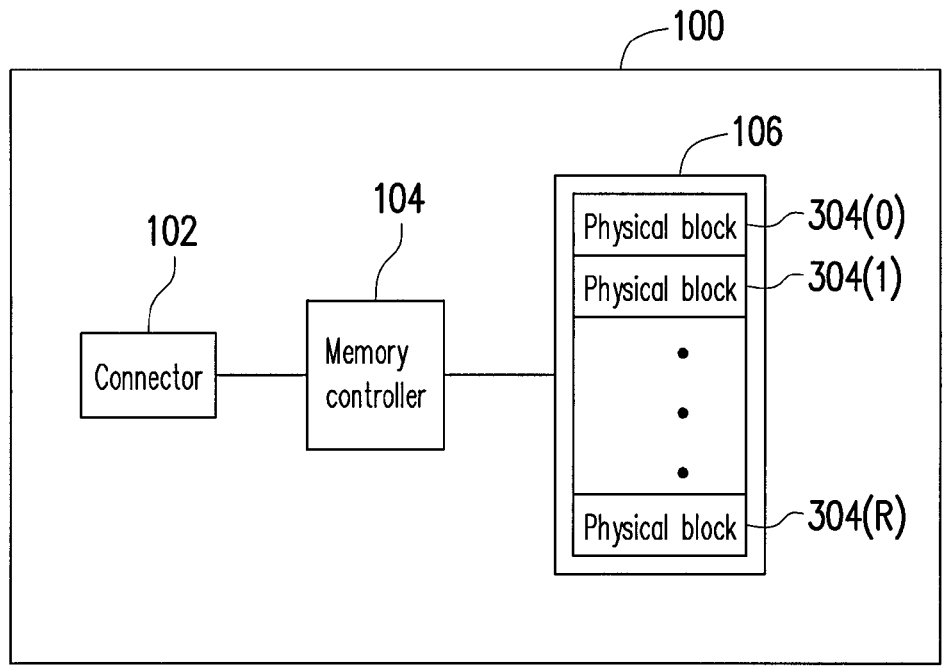
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a memory chip 106.

In the present exemplary embodiment, the connector 102 is a serial advanced technology attachment (SATA) connector. However, the present invention is not limited thereto, and the connector 102 may also be a universal serial bus (USB) connector, an Institute of Electrical and Electronic Engineers (IEEE) 1394 connector, a peripheral component interconnect (PCI) express connector, a secure digital (SD) interface connector, a memory stick (MS) interface connector, a multi media card (MMC) interface connector, a compact flash (CF) interface connector, an integrated device electronics (IDE) connector, or other suitable connectors.

The memory controller 104 executes a plurality of logic gates or control instructions implemented in a hardware or firmware form and executes various data operations on the memory chip 106 according to commands from the host system 1000. In particular, the memory controller 104 executes a data access mechanism and a memory management mechanism according to the present exemplary embodiment.

The memory chip 106 is coupled to the memory controller 104 and used for storing data from the host system 1000. The memory chip 106 includes physical blocks 304(0)-304(R). Each of the physical blocks has a plurality of pages, and the physical pages belonging to the same physical block can be individually written and must be simultaneously erased. To be specific, each physical block is the smallest unit for erasing data. Namely, each physical block contains the least number of memory cells that are erased together. Each physical page is the smallest unit for programming data. Namely, each physical page is the smallest unit for writing data.

In the present exemplary embodiment, the memory chip 106 is a rewritable non-volatile memory, such as a multi level cell (MLC) NAND flash memory chip. However, the present invention is not limited thereto, and the memory chip 106 may also be a single level cell (SLC) NAND flash memory chip, other flash memory chips, or other memory chips having the same characteristics.

Figure 3:
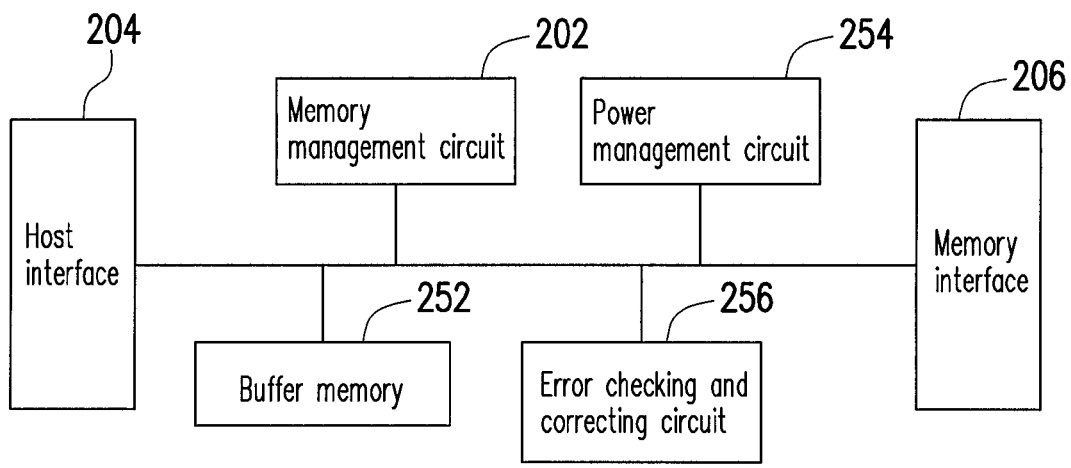
FIG. 3 is a schematic block diagram of a memory controller according to the first exemplary embodiment of the present invention.

FIG. 3 is a schematic block diagram of a memory controller according to the first exemplary embodiment of the present invention.

Referring to FIG. 3, the memory controller 104 includes a memory management circuit 202, a host interface 204, and a memory interface 206.

The memory management circuit 202 controls the operation of the memory controller 104. To be specific, the memory management circuit 202 has a plurality of control instructions. When the memory storage apparatus 100 is in operation, the control instructions are executed to manage the memory chip 106 according to the error correcting mechanism, the data access mechanism, and the memory management mechanism of the present exemplary embodiment. Below, the error correcting mechanism, the data access mechanism, and the memory management mechanism will be described in detail with reference to accompanying drawings.

In the present exemplary embodiment, the control instructions of the memory management circuit 202 are implemented in a firmware form. For example, the memory management circuit 202 has a microprocessor unit (not shown) and a real-only memory (ROM, not shown), and the control instructions are burnt into the ROM. When the memory storage apparatus 100 is in operation, the control instructions are executed by the microprocessor unit to accomplish the error correcting mechanism, the data access mechanism, and the memory management mechanism according to the present exemplary embodiment.

In another exemplary embodiment of the present invention, the control instructions of the memory management circuit 202 are stored in a specific area (for example, a system area exclusively used for storing system data in a memory chip) of the memory chip 106 as program codes. In addition, the memory management circuit 202 has a microprocessor unit (not shown), a ROM (not shown), and a RAM (not shown). Particularly, the ROM has driving codes, and when the memory controller 104 is enabled, the microprocessor unit first executes the driving codes to load the control instructions from the memory chip 106 into the RAM of the memory management circuit 202. After that, the microprocessor unit runs the control instructions to execute the error correcting mechanism, the data access mechanism, and the memory management mechanism according to present exemplary embodiment. Moreover, in another exemplary embodiment of the present invention, the control instructions of the memory management circuit 202 may also be implemented in a hardware form.

The host interface 204 is coupled to the memory management circuit 202 and configured for receiving and identifying commands and data from the host system 1000. Namely, the commands and data received from the host system 1000 are transmitted to the memory management circuit 202 through the host interface 204. In the present exemplary embodiment, the host interface 204 is a SATA interface corresponding to the connector 102. However, the present invention is not limited thereto, and the host interface 204 may also be a PATA interface, a USB interface, an IEEE 1394 interface, a PCI express interface, a SD interface, a MS interface, a MMC interface, a CF interface, an IDE interface, or other suitable data transmission interfaces.

The memory interface 206 is coupled to the memory management circuit 202 and configured for accessing the memory chip 106. Namely, data to be written into the memory chip 106 is converted by the memory interface 206 into a format acceptable to the memory chip 106.

In an exemplary embodiment of the present invention, the memory controller 104 further includes a buffer memory 252. The buffer memory 252 is coupled to the memory management circuit 202 and configured for temporarily storing data and commands from the host system 1000 or data from the memory chip 106.

In an exemplary embodiment of the present invention, the memory controller 104 further includes a power management circuit 254. The power management circuit 254 is coupled to the memory management circuit 202 and configured for controlling the power supply of the memory storage apparatus 100.

In an exemplary embodiment of the present invention, the memory controller 104 further includes an error checking and correcting (ECC) circuit 256. The ECC circuit 256 is coupled to the memory management circuit 202 and configured for executing an error checking and correcting procedure to ensure data accuracy. To be specific, when the memory management circuit 202 receives a write command from the host system 1000, the ECC circuit 256 generates an ECC code for the data corresponding to the write command, and the memory management circuit 202 writes the data corresponding to the write command and the corresponding ECC code into the memory chip 106. Subsequently, when the memory management circuit 202 reads the data from the memory chip 106, it simultaneously reads the corresponding ECC code, and the ECC circuit 256 executes the ECC procedure on the read data based on the ECC code.

Figure 4:
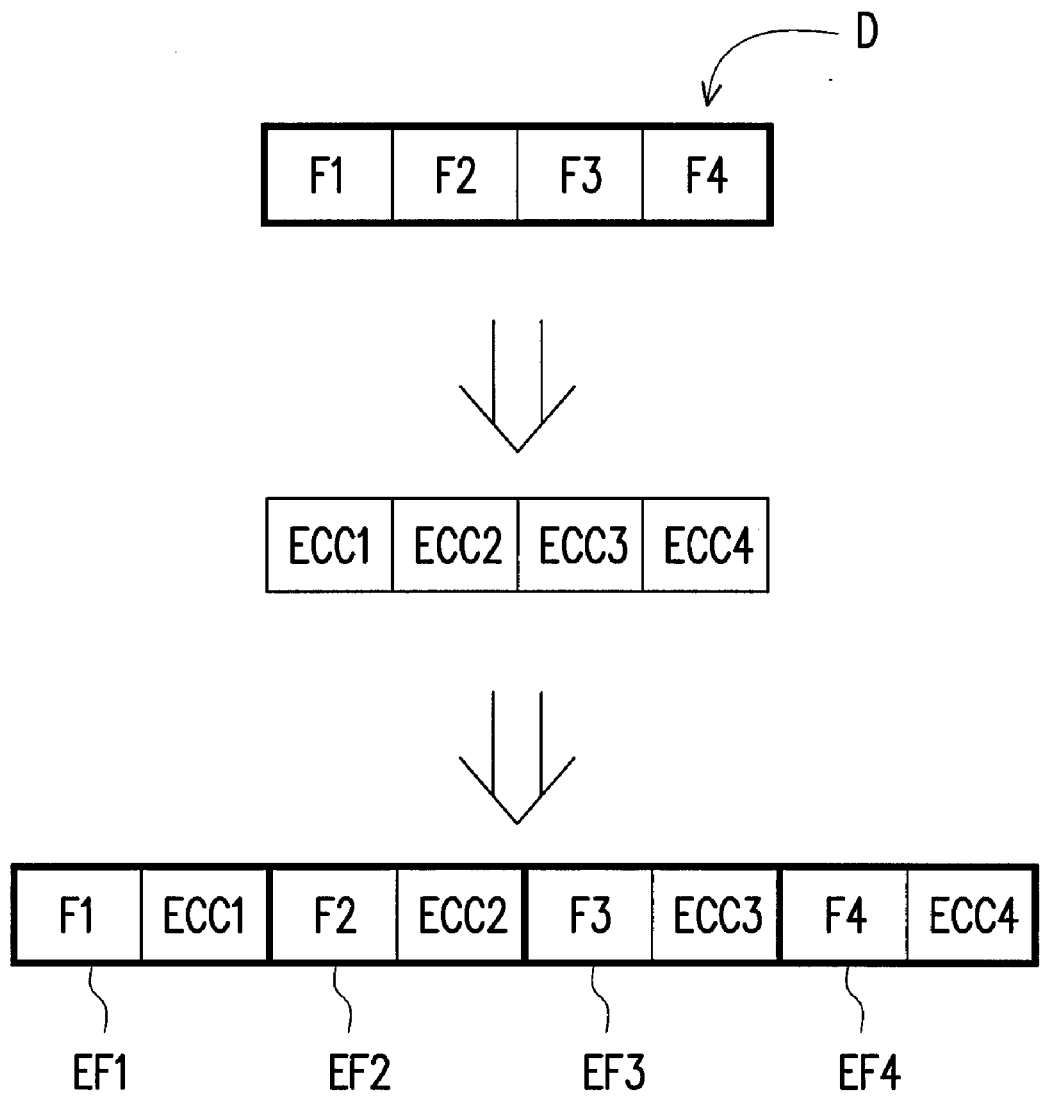
FIG. 4 illustrates an example of writing data and corresponding ECC codes into physical pages according to the first exemplary embodiment of the present invention.

FIG. 4 illustrates an example of writing data and corresponding ECC codes into physical pages according to the first exemplary embodiment of the present invention.

Referring to FIG. 4, when the host system 1000 gives a write command and data D corresponding to the write command to the memory storage apparatus 100, the memory management circuit 202 divides the data D into at least one frame in unit of a predetermined size, wherein the predetermined size varies along the design of the ECC circuit 256. For example, the data D is divided into frames F1-F4. Then, the ECC circuit 256 respectively generates corresponding ECC codes ECC1-ECC4 for the frames F1-F4. Next, the ECC circuit 256 combines the frames F1-F4 and the ECC codes ECC1-ECC4 to generate ECC frames EF1-EF4 respectively. After that, the memory management circuit 202 writes the ECC frames EF1-EF4 into the physical pages. For example, when each physical page has the capacity for storing four ECC frames, the ECC frames EF1-EF4 are sequentially written into one physical page, and when each physical page has the capacity for storing two ECC frames, the ECC frames EF1-EF4 are sequentially written into two physical pages.

Subsequently, when the host system 1000 is about to read the data D from the memory storage apparatus 100, the memory management circuit 202 reads the ECC frames EF1-EF4 from the physical page(s), and the ECC circuit 256 respectively executes the error checking and correcting procedure on the frames F1-F4 according to the ECC codes ECC1-ECC4. Thereby, the ECC circuit 256 can correct the error bits in data within the error correcting ability of the ECC circuit 256, and accordingly the accuracy of the data can be ensured.

Figure 5:
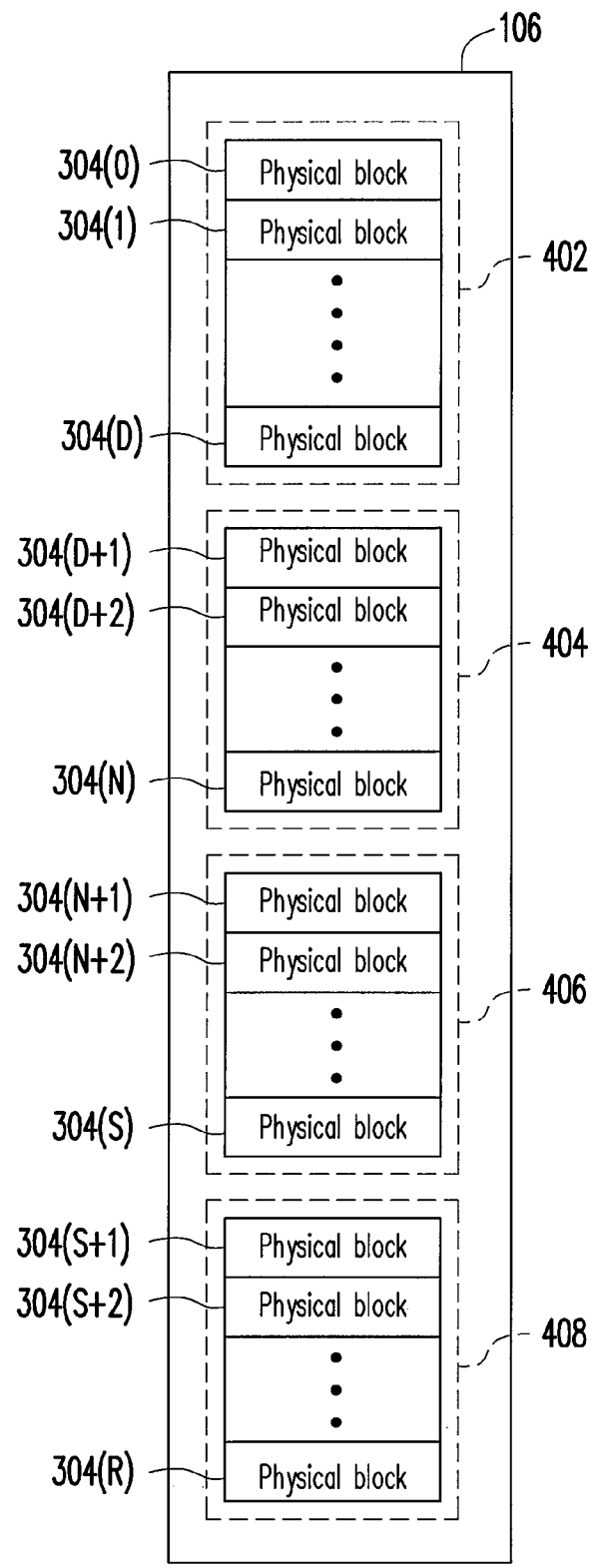
FIG. 5 and FIG. 6 are diagrams illustrating the management of a memory chip according to the first exemplary embodiment of the present invention.
Figure 6:
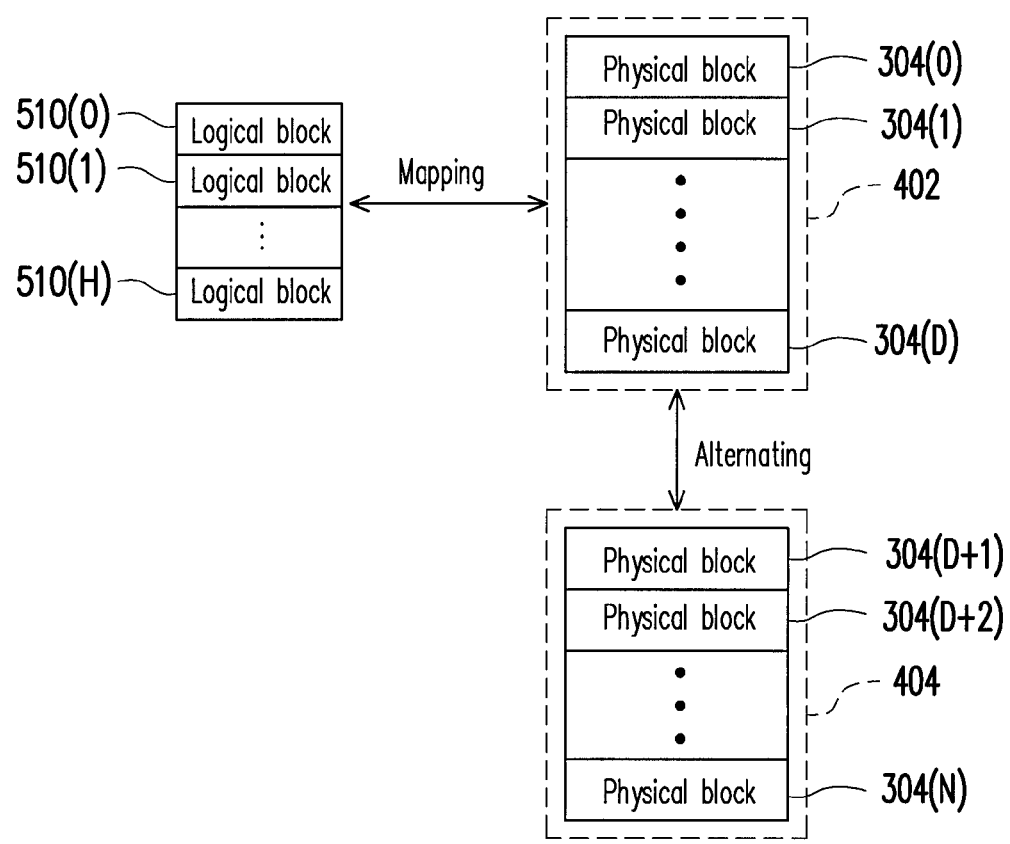

FIG. 5 and FIG. 6 are diagrams illustrating the management of a memory chip according to the first exemplary embodiment of the present invention.

It should be understood that the terms used for describing the operations executed on the physical blocks of the memory chip 106, such as "select", "substitute", "group", and "alternate", only refer to logical operations. Namely, the actual positions of the physical blocks of the memory chip 106 are not changed. Instead, the physical blocks of the memory chip 106 are only logically operated.

Referring to FIG. 5, the memory management circuit 202 logically groups the physical blocks 304(0)-304(R) of the memory chip 106 into a data area 402, a spare area 404, a system area 406, and a replacement area 408.

The physical blocks in the data area 402 and the spare area 404 are used for storing data from the host system 1000. To be specific, the physical blocks of the data area 402 are physical blocks which have been used for storing data, and the physical blocks of the spare area 404 are physical blocks which are used for substituting the physical blocks of the data area 402. Thus, the physical blocks in the spare area 404 are either blank or available physical blocks (i.e., no data is recorded therein or data recorded therein is marked as invalid data). That is, the physical blocks of the spare area 404 have been operated by an erasing operation, or when a physical block of the spare area 404 is gotten for storing data, the gotten physical block needs to be operated by the erasing operation first. Hence, the physical blocks of the spare area 404 are available physical blocks.

The physical blocks logically belonging to the system area 406 are used for storing system data, such as the manufacturer and model of the memory chip, the number of physical blocks in the memory chip, and the number of physical pages in each physical block, etc.

The physical blocks logically belonging to the replacement area 408 are replacement physical blocks. For example, 4% of the physical blocks in the memory chip 106 are reserved for replacement purpose. Namely, when a physical block in the data area 402, the spare area 404, or the system area 406 is damaged, a physical block reserved in the replacement area 408 is used for replacing the damaged physical block (i.e., a bad block). Thus, if there are still normal physical blocks in the replacement area 408 and a physical block is damaged, the memory management circuit 202 gets a physical block from the replacement area 408 to replace the damaged physical block. If there is no normal physical block in the replacement area 408 and a physical block is damaged, the memory management circuit 202 announces that the memory storage apparatus 100 is in a write-protect status and the memory storage apparatus 100 cannot be used for writing data anymore.

Particularly, the numbers of physical blocks in the data area 402, the spare area 404, the system area 406, and the replacement area 408 are various based on different standards of the memory chips. Additionally, it has to be understood that the grouping relationships of grouping the physical blocks into the data area 402, the spare area 404, the system area 406 and the replacement area 408 are dynamically changed during the operation of the memory storage apparatus 100. For example, when a physical block in the spare area 404 is damaged and accordingly is replaced by a physical block in the replacement area, the physical block originally in the replacement area 408 is associated with the spare area 404.

Referring to FIG. 6, as described above, the physical blocks in the data area 402 and the spare area 404 are alternatively used for storing data from the host system 1000. In the present exemplary embodiment, the memory management circuit 202 configures logical addresses for the host system 1000 so that the host system 1000 can smoothly access data in the physical blocks that are alternatively used for storing data. In particular, the memory management circuit 202 groups the logical addresses into logical blocks 510(0)-510(H) and maps the logical blocks 510(0)-510(H) to the physical blocks in the data area 402. For example, when the memory storage apparatus 100 is initialized (for example, formatted), the logical blocks 510(0)-510(H) are respectively mapped to the physical blocks 304(0)-304(D) in the data area 402. Namely, one logical block is mapped to one physical block in the data area 402. The memory management circuit 202 then establishes a logical block-physical block mapping table to record the mapping relationship between the logical blocks and the physical blocks.

FIGS. 7-10 illustrate an example of writing data into a memory chip according to the first exemplary embodiment of the present invention.

Figure 7:
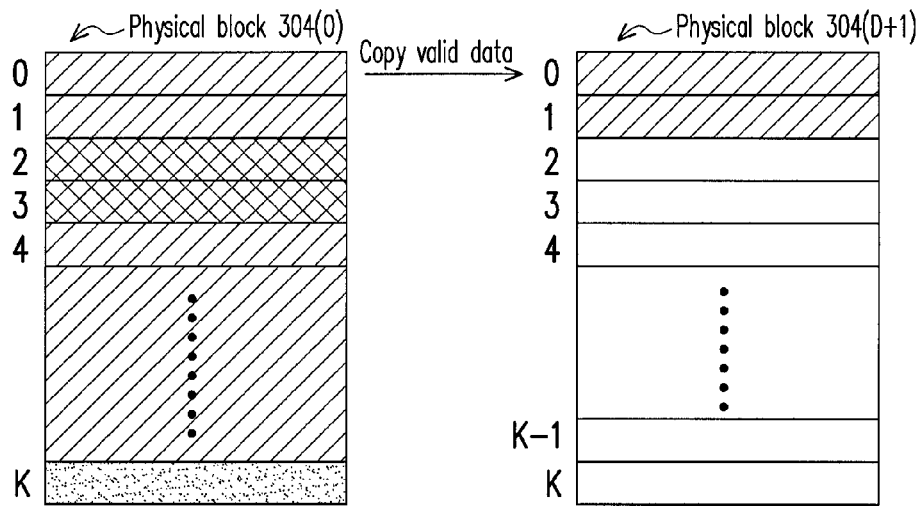
FIGS. 7-10 illustrate an example of writing data into a memory chip according to the first exemplary embodiment of the present invention.
Figure 8:
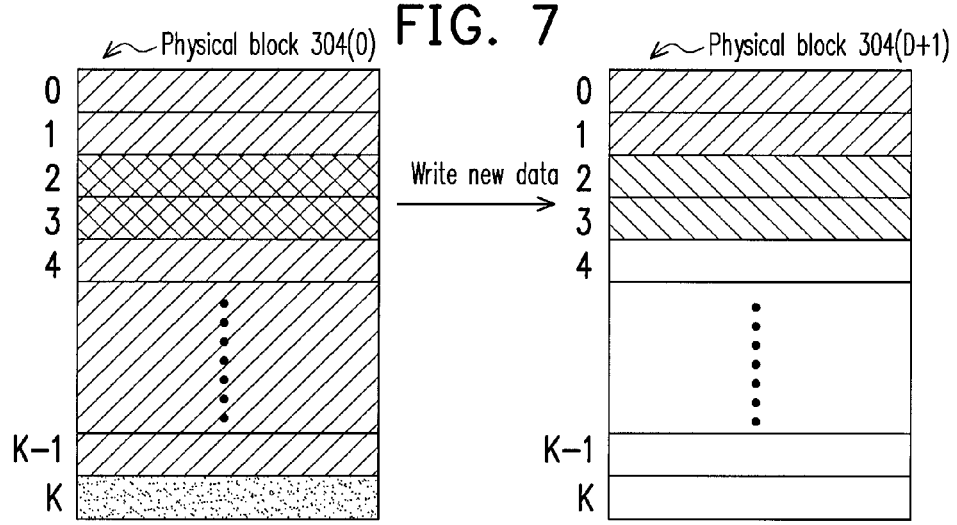

Referring to FIGS. 7-10, assuming that the logical block 510(0) is mapped to the physical block 304(0), when the memory controller 104 receives a write command from the host system 1000 and accordingly is about to write data into logical addresses belonging to the logical block 510(0), the memory management circuit 202 identifies that the logical block 510(0) is currently mapped to the physical block 304(0) according to the logical block-physical block mapping table and gets the physical block 304(D+1) from the spare area 404 as a substitute physical block for substituting the physical block 304(0). However, when executing the write command, the memory management circuit 202 does not instantly move all the valid data from the physical block 304(0) to the physical block 304(D+1) and erase the physical block 304(0). To be specific, the memory management circuit 202 copies the valid data before the physical pages for writing the new data in the physical block 304(0) (i.e., data in the $0^{th}$ physical page and the $1^{st}$ physical page of the physical block 304(0)) to the $0^{th}$ physical page and the $1^{st}$ physical page of the physical block 304(D+1) (as shown in FIG. 7), and writes the new data into the $2^{nd}$ physical page and the $3^{rd}$ physical page of the physical block 304(D+1) (as shown in FIG. 8). At this time, the memory management circuit 202 has completed the writing operation. Since the valid data in the physical block 304(0) may become invalid during a next operation (for example, a next write command), instantly moving all the valid data in the physical block 304(0) to the physical block 304(D+1) may become meaningless. In addition, since data has to be sequentially written into the physical pages of a physical block, the memory management circuit 202 only moves the valid data before the physical pages for writing new data.

In the present exemplary embodiment, the operation of temporarily keeping this temporary relationship (i.e., a relationship between the physical block 304(0) and the physical block 304(D+1)) is referred to as opening mother-child blocks, wherein the original physical block is referred to as a mother physical block, while the substitute physical block is referred to as a child physical block.

Figure 9:
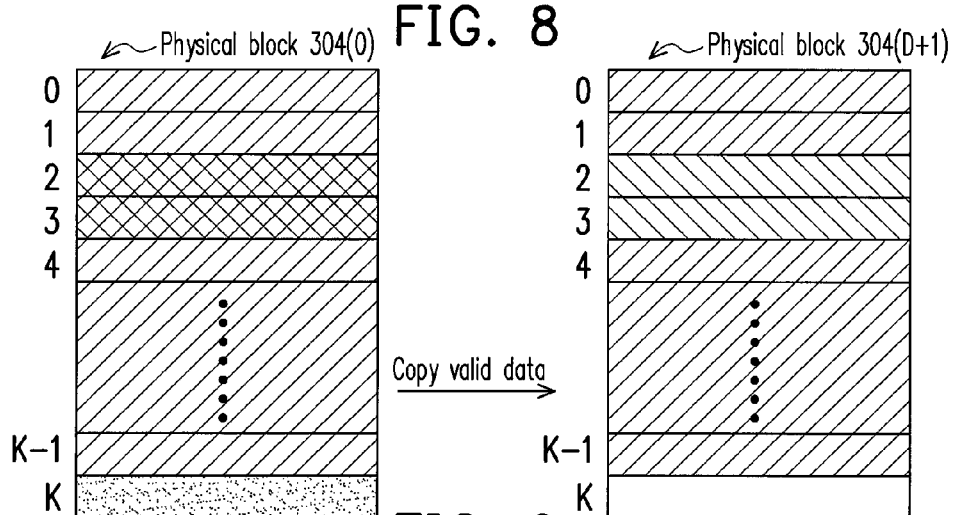

The memory management circuit 202 integrates the physical block 304(0) and the physical block 304(D+1) into a single physical block when the contents of the two are to be actually combined, so that the efficiency of using these physical blocks can be increased. Herein the operation of integrating mother-child blocks is referred to as closing the mother-child blocks. For example, as shown in FIG. 9, while closing mother-child blocks, the memory management circuit 202 copies rest of valid data in the physical block 304(0) (i.e., data in the $4^{th}$~$(K-1)^{th}$ physical pages of the physical block 304(0)) to the $4^{th}$~$(K-1)^{th}$ physical pages of the physical block 304(D+1), and then, the memory management circuit 202 erases the physical block 304(0) and associates it with the spare area 404. Meanwhile, the memory management circuit 202 associates the physical block 304(D+1) with the data area 402. Namely, the memory management circuit 202 maps the logical block 510(0) to the 304(D+1) in the logical block-physical block mapping table. Additionally, in the present exemplary embodiment, the memory management circuit 202 establishes a spare area physical block table (not shown) to record the physical blocks currently associated with the spare area 404. It should be mentioned that while opening mother-child blocks, the memory management circuit 202 needs to use more storage space of the buffer memory 252 to store management variables for recoding detail storage statuses. For example, the management variables record which physical pages of the physical blocks 304(0) and 304(D+1) are used to store valid data of the logical block 510(0) (as shown in FIG. 8). Accordingly, during the operation of the memory storage apparatus 100, the number of mother-child blocks is limited. Therefore, when the memory storage apparatus 100 receives a write command from the host system 1000 and the number of opened mother-child blocks reaches the maximum, the memory management circuit 202 has to close at least one set of the opened mother-child blocks (i.e., executes the operation of closing mother-child blocks) before it executes the write command.

It should be mentioned that besides the aforementioned error checking and correcting procedure, the memory management circuit 202 further generates parity information for the data stored in the physical blocks, such that error bits in the data can be corrected according to the parity information when the error bits cannot be corrected through the error checking and correcting procedure.

To be specific, the memory management circuit 202 generates parity information for all data stored in a physical block in unit of physical pages of the physical block through an XOR calculation and stores the parity information into the last physical page of the physical block. Namely, in the present exemplary embodiment, the memory management circuit 202 uses the last physical page of a physical block for storing the parity information corresponding to all the data in the physical block. For example, as shown in FIG. 10, when the $0^{th}$~$(K-1)^{th}$ physical pages of the physical block 304(D+1) have been used for storing data, the memory management circuit 202 generates parity information for the data stored in the $0^{th}$~$(K-1)^{th}$ physical pages of the physical block 304(D+1) and stores the parity information into the $K^{th}$ physical page of the physical block 304(D+1).

Figures 10, 11:
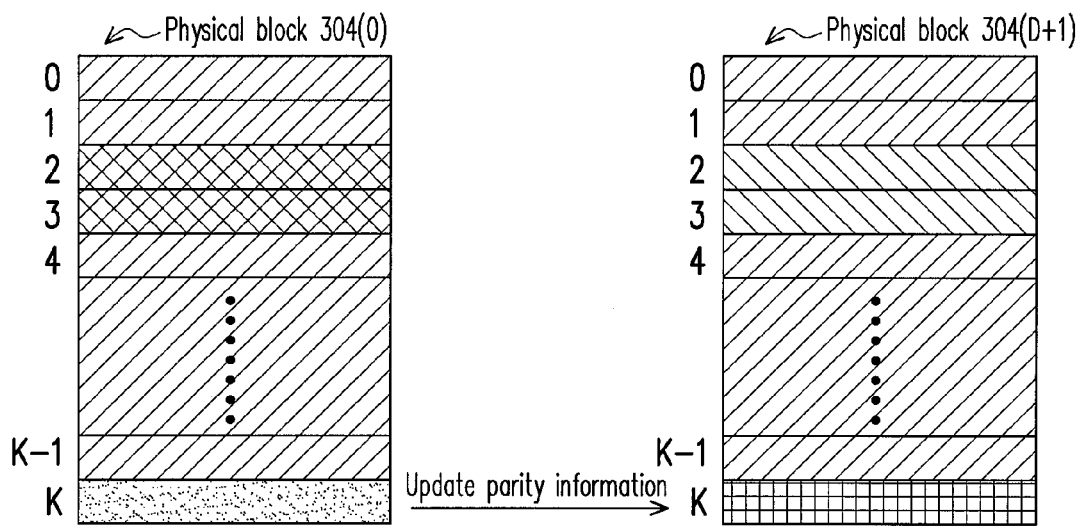
FIG. 11 illustrates an example of generating and storing a parity information according to the first exemplary embodiment of the present invention.

FIG. 11 illustrates an example of generating and storing parity information according to the first exemplary embodiment of the present invention. For the convenience of description, it is assumed in the example illustrated in FIG. 11 that the physical block 304(D+1) has 6 physical pages and each physical page has a 4-bit capacity. However, it should be understood that in a general memory chip, each physical block may have 64, 128, or 192 physical pages, and each physical page may have a capacity of 2 kilobytes (KB), 4 KB, or 8 KB.

Referring to FIG. 11, after data "1010", "1011", "1100", "0101", and "0011" is sequentially written into the $0^{th}$~$4^{th}$ physical pages of the physical block 304(D+1), the memory management circuit 202 executes the XOR calculation on the data in the $0^{th}$ physical page and the data in the $1^{st}$ physical page to obtain "0001". After that, the memory management circuit 202 executes the XOR calculation on "0001" and the data in the $2^{nd}$ physical page to obtain "1101". Next, the memory management circuit 202 executes the XOR calculation on "1101" and the data in the $3^{rd}$ physical page to obtain "1000". Finally, the memory management circuit 202 executes the XOR calculation on "1000" and the data in the $4^{th}$ physical page to obtain "1011" and stores "1011" as the parity information corresponding to the data in the physical block 304(D+1) into the $5^{th}$ physical page of the physical block 304(D+1).

Thereafter, if error bits occur in the data stored in one of the $0^{th}$~$4^{th}$ physical pages of the physical block 304(D+1) and the error bits cannot be corrected by the ECC circuit 256, the memory management circuit 202 reversely executes the foregoing XOR calculation to obtain the correct value.

For example, if error bits occur in the data stored in the $3^{rd}$ physical page of the physical block 304(D+1) and the error bits cannot be corrected by the ECC circuit 256, the memory management circuit 202 executes the XOR calculation on the parity information (i.e., "1011") in the $5^{th}$ physical page of the physical block 304(D+1) and the data in the $4^{th}$ physical page of the physical block 304(D+1) to obtain "1000". After that, the memory management circuit 202 executes the XOR calculation on the data in the $0^{th}$ physical page and the data in the $1^{st}$ physical page to obtain "0001". Next, the memory management circuit 202 executes the XOR calculation on "0001" and the data in the $2^{nd}$ physical page to obtain "1101". Finally, the memory management circuit 202 executes the XOR calculation on "1000" and "1101" to obtain the correct data (i.e., "0101") stored in the $3^{rd}$ physical page of the physical block 304(D+1).

Figure 12:
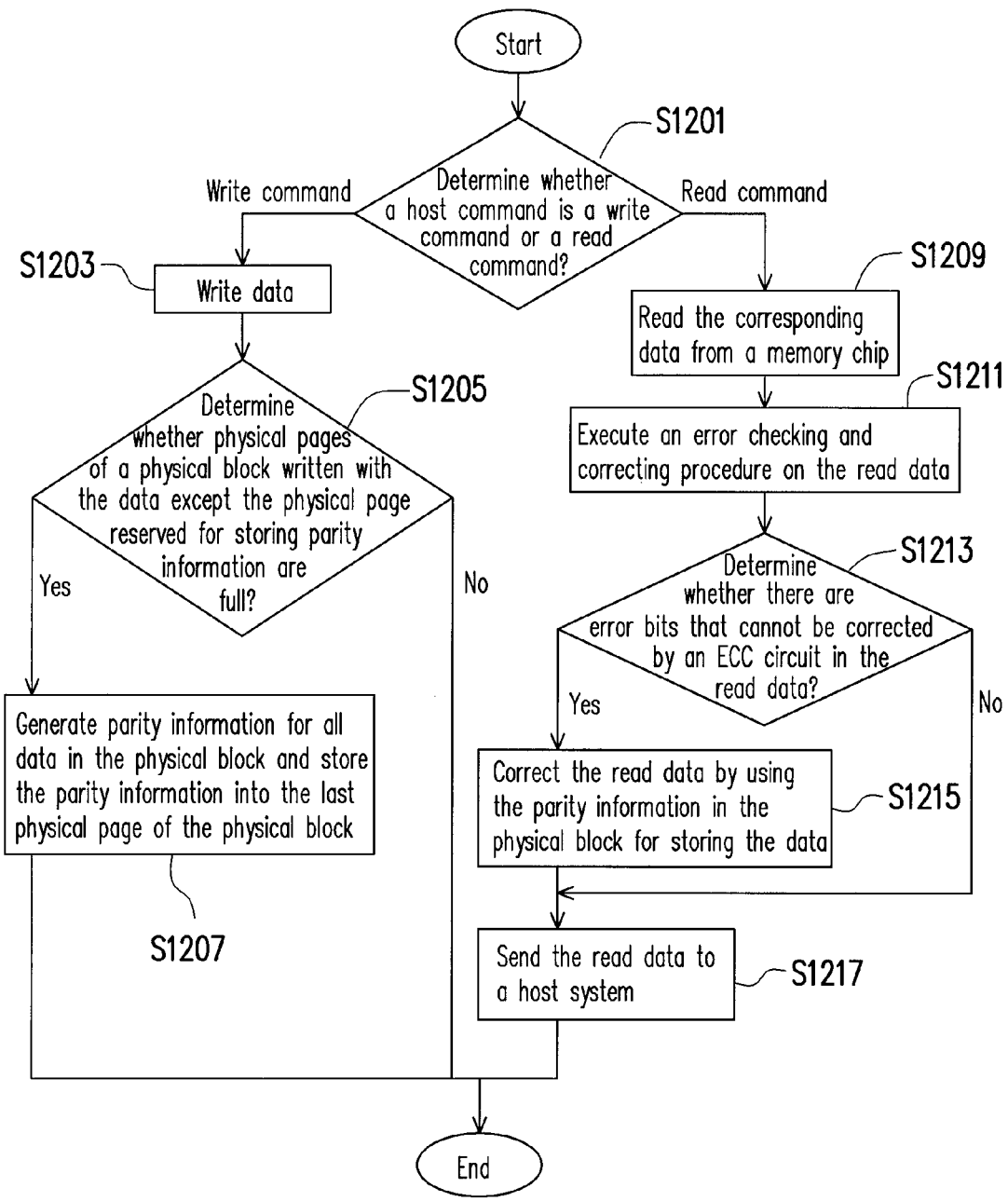
FIG. 12 is a flowchart of an error correcting method according to the first exemplary embodiment of the present invention.

FIG. 12 is a flowchart of an error correcting method according to the first exemplary embodiment of the present invention.

Referring to FIG. 12, when the memory storage apparatus 100 receives a host command from the host system 1000, in step S1201, the memory management circuit 202 determines whether the host command is a write command or a read command.

If the host command is a write command, in step S1203, the memory management circuit 202 writes the data, and in step S1205, the memory management circuit 202 determines whether the physical pages of the physical block written with the data except the physical page reversed for storing parity information are full.

If the physical pages except the physical page reserved for storing parity information in the physical block are full, in step S1207, the memory management circuit 202 generates parity information for all data in the physical block and stores the parity information into the last physical page of the physical block. The method for generating the parity information has been described in detail above therefore will not be described herein. If the physical pages except the physical page for storing parity information in the physical block are not full, the procedure illustrated in FIG. 12 is terminated.

If the host command is a read command, in step S1209, the memory management circuit 202 reads the corresponding data from the memory chip 106. In step S1211, the ECC circuit 256 executes the error checking and correcting procedure on the data.

After that, in step S1213, the memory management circuit 202 determines whether there are error bits that cannot be corrected by the ECC circuit 256 in the read data.

If there are error bits that cannot be corrected by the ECC circuit 256 in the read data, in step S1215, the memory management circuit 202 corrects the data by using the parity information in the physical block for storing the data. The method of correcting error bits in data according to parity information has been described in detail above therefore will not be described herein. Next, in step S1217, the memory management circuit 202 sends the read data to the host system 1000.

Step S1217 is executed if there is no error bit that cannot be corrected by the ECC circuit 256 in the read data.

Second Exemplary Embodiment

The memory storage apparatus in the second exemplary embodiment is substantially the same as that in the first exemplary embodiment. Accordingly, only the differences between the two are described herein. Below, the second exemplary embodiment will be described with reference to FIG. 2 and FIG. 3 of the first exemplary embodiment.

The memory management circuit 202 in the second exemplary embodiment also executes data operations on the memory chip 106 according to the error correcting mechanism, the data access mechanism, and the memory management mechanism illustrated in FIGS. 4-11. In the present exemplary embodiment, besides executing the operations of opening and closing mother-child physical blocks to write data, the memory management circuit 202 further executes a random write mode to write data.

To be specific, because the programming standard of the memory chip 106 requests that data has to be written from the first physical page to the last physical page in each physical block and each bit is only programmed once (i.e., from "1" to "0"), once data is written into the physical pages of a physical block, a physical block has to be gotten from the spare area 404 (as shown in FIG. 7) and the steps illustrated in FIGS. 7-9 have to be executed to update the data. Thus, when the data that is just moved (for example, the data in the $0^{th}$ physical page and the $1^{st}$ physical page, as shown in FIG. 7) has to be updated before the operation of closing mother-child blocks (as shown in FIG. 9) is executed on the physical block (i.e., the physical block is in the temporary state illustrated in FIG. 8), the old data that is just moved has to be moved again, and this is referred to as a random write mode. In the random write mode, the memory management circuit 202 gets a physical block from the spare area 404 as a random physical block and directly writes new data into the gotten physical block starting from the $1^{st}$ physical page thereof without executing the operations illustrated in FIG. 7 (i.e., the operations of copying valid data). Besides, the memory management circuit 202 gets another physical block from the spare area 404 for writing all the valid data after the random write mode is over.

Particularly, in the random write mode, the memory management circuit 202 generates a parity information for the data corresponding to each write command.

Figure 13:
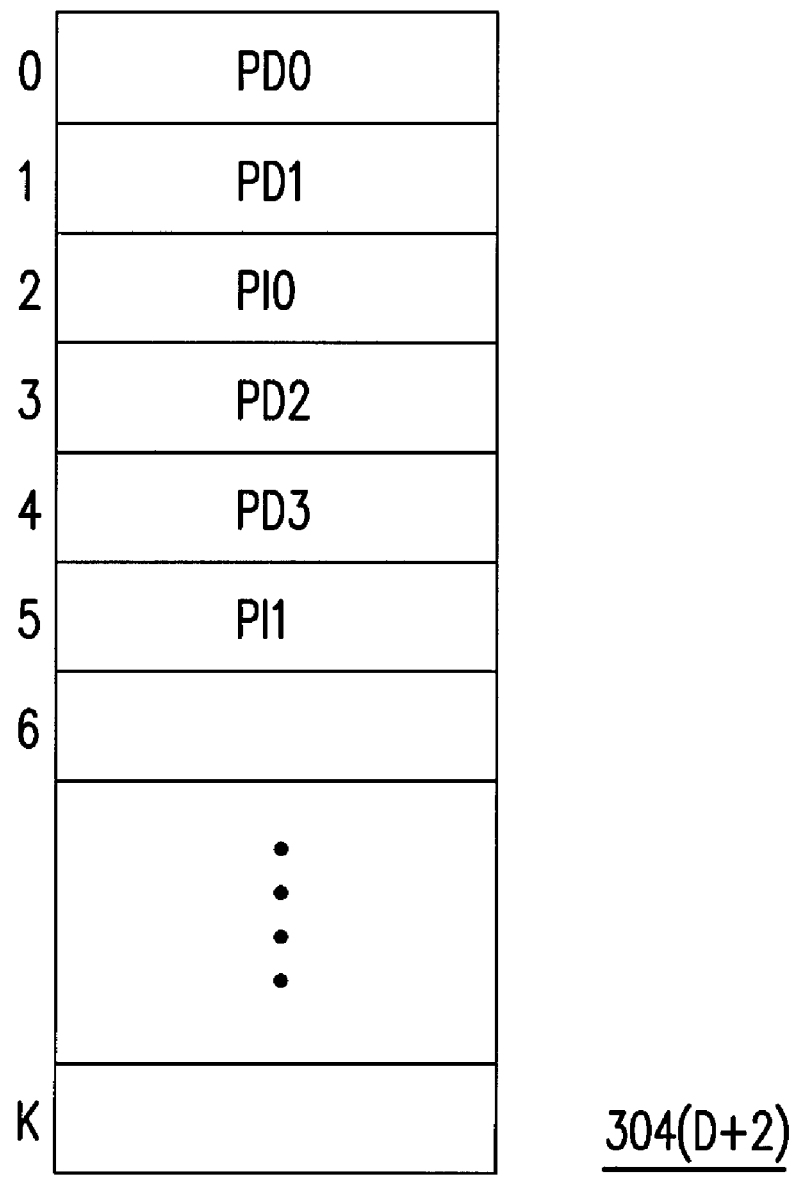
FIG. 13 illustrates an example of generating and storing a parity information in a random write mode according to a second exemplary embodiment of the present invention.

FIG. 13 illustrates an example of generating and storing a parity information in a random write mode according to the second exemplary embodiment of the present invention.

Referring to FIG. 13, when the memory management circuit 202 receives a write command and data PD0 and data PD1 corresponding to two physical pages from the host system 1000 and gets the physical block 304(D+2) from the spare area 404 as the random physical block (and accordingly enters the random write mode), the memory management circuit 202 writes the data PD0 and the ECC code corresponding to the data PD0 into the $0^{th}$ physical page of the physical block 304(D+2) and writes the PD1 and the ECC code corresponding to the data PD1 into the $1^{st}$ physical page of the physical block 304(D+2). After that, the memory management circuit 202 generates parity information PI0 corresponding to the data PD0 and PD1 in the $0^{th}$ physical page and the $1^{st}$ physical page through the XOR calculation and writes the parity information PI0 into the $2^{nd}$ physical page following the data PD0 and PD1. Herein the method of generating the parity information is the same as that illustrated in FIG. 11 therefore will not be described herein.

Subsequently, when the memory management circuit 202 receives another write command and data PD2 and data PD3 corresponding to two physical pages from the host system 1000, the memory management circuit 202 writes the data PD2 and the ECC code corresponding to the data PD2 into the $3^{rd}$ physical page of the physical block 304(D+2) and writes the data PD3 and the ECC code corresponding to the data PD3 into the $4^{th}$ physical page of the physical block 304(D+2). After that, the memory management circuit 202 generates parity information PI1 corresponding to the data PD2 and PD3 in the $3^{rd}$ physical page and the $4^{th}$ physical page through the XOR calculation and writes the parity information PI1 into the $5^{th}$ physical page following the data PD2 and PD3. Namely, in the random write mode, when data corresponding to a plurality of write commands is written into the random physical block, the memory management circuit 202 uses a plurality of physical pages of the random physical block for storing a plurality of pieces of parity information corresponding to the data of the write commands. Besides, in the random write mode, if any error bit that cannot be corrected by the ECC circuit 256 occurs in the data stored in the random physical block, the memory management circuit 202 corrects the error bit according to the parity information in the random physical block.

Particularly, after the random write mode is over, the memory management circuit 202 generates parity information for all the valid data in the physical block, as shown in FIG. 10.

Figure 14:
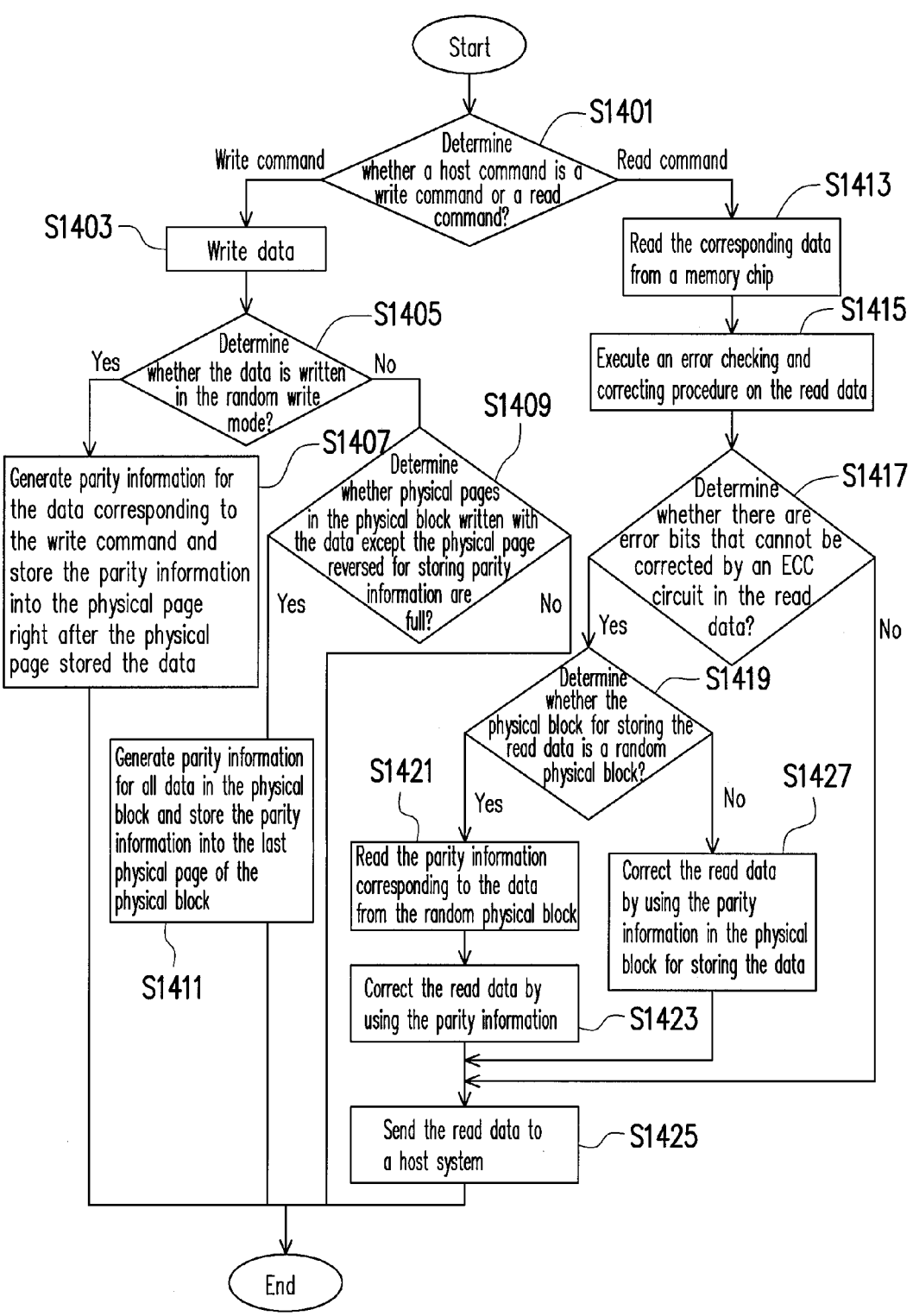
FIG. 14 is a flowchart of an error correcting method according to the second exemplary embodiment of the present invention.

FIG. 14 is a flowchart of an error correcting method according to the second exemplary embodiment of the present invention.

Referring to FIG. 14, when the memory storage apparatus 100 receives a host command from the host system 1000, in step S1401, the memory management circuit 202 determines whether the host command is a write command or a read command.

If the host command is a write command, in step S1403, the memory management circuit 202 writes data, and in step S1405, the memory management circuit 202 determines whether the data is written in the random write mode.

If the data is written in the random write mode, in step S1407, the memory management circuit 202 generates parity information for the data corresponding to the write command and stores the parity information into the physical page right after the physical page storing the data.

If the data is not written in the random write mode, in step S1409, the memory management circuit 202 determines whether the physical pages in the physical block written with the data except the physical page reserved for storing parity information are full.

If the physical pages in the physical block except the physical page reserved for storing parity information are full, in step S1411, the memory management circuit 202 generates parity information according to the data in the physical block and stores the parity information into the last physical page of the physical block. If the physical pages in the physical block except the physical page for storing the parity information are not full, the procedure illustrated in FIG. 14 is terminated.

If the host command is a read command, in step S1413, the memory management circuit 202 reads the corresponding data from the memory chip 106. In step S1415, the ECC circuit 256 executes the error checking and correcting procedure on the read data.

After that, in step S1417, the memory management circuit 202 determines whether there are error bits that cannot be corrected by the ECC circuit 256 in the read data.

If there are error bits that cannot be corrected by the ECC circuit 256 in the data, in step S1419, the memory management circuit 202 determines whether the physical block storing the read data is a random physical block.

If the physical block storing the read data is a random physical block, in step S1421, the memory management circuit 202 reads the parity information corresponding to the data from the random physical block. To be specific, the memory management circuit 202 can correctly read the corresponding parity information since the parity information is stored in the physical page right after the physical page storing the data. Thereafter, in step S1423, the memory management circuit 202 corrects the read data according to the parity information, and in step S1425, the memory management circuit 202 sends the read data to the host system 1000.

If the physical block storing the data is not a random physical block, in step S1427, the memory management circuit 202 corrects the read data by using the parity information in the physical block for storing the read data (as described in the first exemplary embodiment). After that, step S1425 is executed.

Step S1425 is executed if there is no error bit that cannot be corrected by the ECC circuit 256 in the read data.

Third Exemplary Embodiment

The memory storage apparatus in the third exemplary embodiment is substantially the same as that in the first exemplary embodiment. Accordingly, only the differences between the two are described herein. Below, the third exemplary embodiment will be described with reference to FIG. 2 and FIG. 3 of the first exemplary embodiment.

The memory management circuit 202 in the third exemplary embodiment also performs operations on the memory chip 106 according to the data access mechanism and the memory management mechanism illustrated in FIGS. 4-10.

The memory chip 106 is a multi level cell (MLC) NAND flash memory. Thus, each memory cell stores a plurality of bits. To be specific, while programming the memory cells of a single level cell (SLC) NAND flash memory, only a single-phase programming is executed and accordingly each memory cell can only store one bit. Contrarily, the programming of physical blocks in a MLC NAND flash memory can be carried out in multiple phases. Taking a 2-bit-per-cell memory cell as an example, the programming of a physical block can be carried out in two phases. During the first phase, data is written into lower physical pages, and the physical characteristic of the lower physical pages is similar to that of a SLC NAND flash memory. The upper physical pages are programmed after the first phase is completed. Because the write speed of the lower physical pages is faster than that of the upper physical pages, the physical pages in each physical block can be categorized into slow physical pages (i.e., the upper physical pages) and fast physical pages (i.e., the lower physical pages).

Similarly, a 3-bit-per-cell memory cell or a 4-bit-per-cell memory cell may have more physical pages and accordingly is programmed in more phases. Herein the physical page having the fastest write speed is referred to as the lower physical page, and other physical pages having slower write speeds are all referred to as upper physical pages. The upper physical pages may include multiple physical pages having different write speeds. Additionally, in other embodiments, the upper physical page(s) may also be defined as the physical page having the slowest write speed or the physical page having the slowest write speed and some physical pages having their write speeds faster than the slowest write speed. For example, in a 4-bit-per-cell memory cell, the lower physical pages are the physical pages having the fastest write speed and the second fastest write speed, and the upper physical pages are the physical pages having the slowest write speed and the second slowest write speed.

Particularly, a charge coupling effect exists between the fast physical pages and the corresponding slow physical pages. Thus, when there is an error bit that cannot be corrected by the ECC circuit 256 in the data stored in a slow physical page, an error bit may also occur in the data stored in the fast physical page corresponding to the slow physical page.

In the present exemplary embodiment, the memory management circuit 202 generates sub parity information for the data stored in the fast physical pages of a physical block and generates another sub parity information for the data stored in the slow physical pages of the same physical block.

Figure 15:
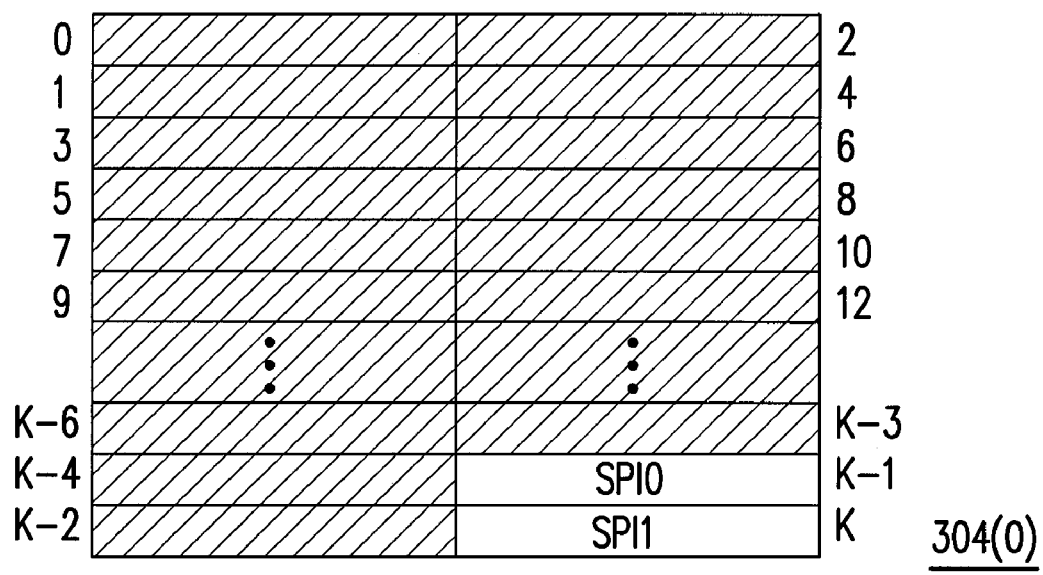
FIG. 15 illustrates an example of generating sub parity information according to the types of physical pages and storing the sub parity information according to a third exemplary embodiment of the present invention.

FIG. 15 illustrates an example of generating sub parity information according to the types of physical pages and storing the sub parity information according to the third exemplary embodiment of the present invention. For the convenience of description, herein a 2-bit-per-cell NAND flash memory is described as an example. However, the memory chip 106 is not limited thereto, and in another exemplary embodiment of the present invention, the memory chip 106 may also be a 3-bit-per-cell or more-bit-per-cell NAND flash memory.

Referring to FIG. 15, the $0^{th}$ physical page, the $1^{st}$ physical page, the $3^{rd}$ physical page, the $5^{th}$ physical page, the $7^{th}$ physical page, . . . , the $(K-6)^{th}$ physical page, the $(K-4)^{th}$ physical page, and the $(K-2)^{th}$ physical page of the physical block 304(0) are fast physical pages, and the $2^{nd}$ physical page, the $4^{th}$ physical page, the $6^{th}$ physical page, the $8^{th}$ physical page, the $10^{th}$ physical page, the $12^{th}$ physical page, . . . , the $(K-3)^{th}$ physical page, the $(K-1)^{th}$ physical page, and the $K^{th}$ physical page of the physical block 304(0) are slow physical pages.

When the $0^{th}$ physical page to $(K-2)^{th}$ physical page of the physical block 304(0) are full, the memory management circuit 202 generates sub parity information SPI0 for the data stored in the $0^{th}$ physical page, the $1^{st}$ physical page, the $3^{rd}$ physical page, the $5^{th}$ physical page, the $7^{th}$ physical page, . . . , the $(K-6)^{th}$ physical page, the $(K-4)^{th}$ physical page, and the $(K-2)^{th}$ physical page and sub parity information SPI1 for the data stored in the $2^{nd}$ physical page, the $4^{th}$ physical page, the $6^{th}$ physical page, the $8^{th}$ physical page, the $10^{th}$ physical page, the $12^{th}$ physical page, . . . , the $(K-3)^{th}$ physical page, the $(K-1)^{th}$ physical page, and the $K^{th}$ physical page through XOR calculations. Herein the method of generating the sub parity information through XOR calculation is the same as that illustrated in FIG. 11 therefore will not be described herein. In addition, the memory management circuit 202 stores the sub parity information SPI0 into the $(K-1)^{th}$ physical page of the physical block 304(0) and stores the sub parity information SPI1 into the $K^{th}$ physical page of the physical block 304(0). Accordingly, when there are error bits that cannot be corrected by the ECC circuit 256 in the data stored in the fast physical pages of the physical block 304(0), the memory management circuit 202 corrects the error bits by using the sub parity information SPI0, and when there are error bits that cannot be corrected by the ECC circuit 256 in the data stored in the slow physical pages of the physical block 304(0), the memory management circuit 202 corrects the error bits by using the sub parity information SPI1.

Figure 16:
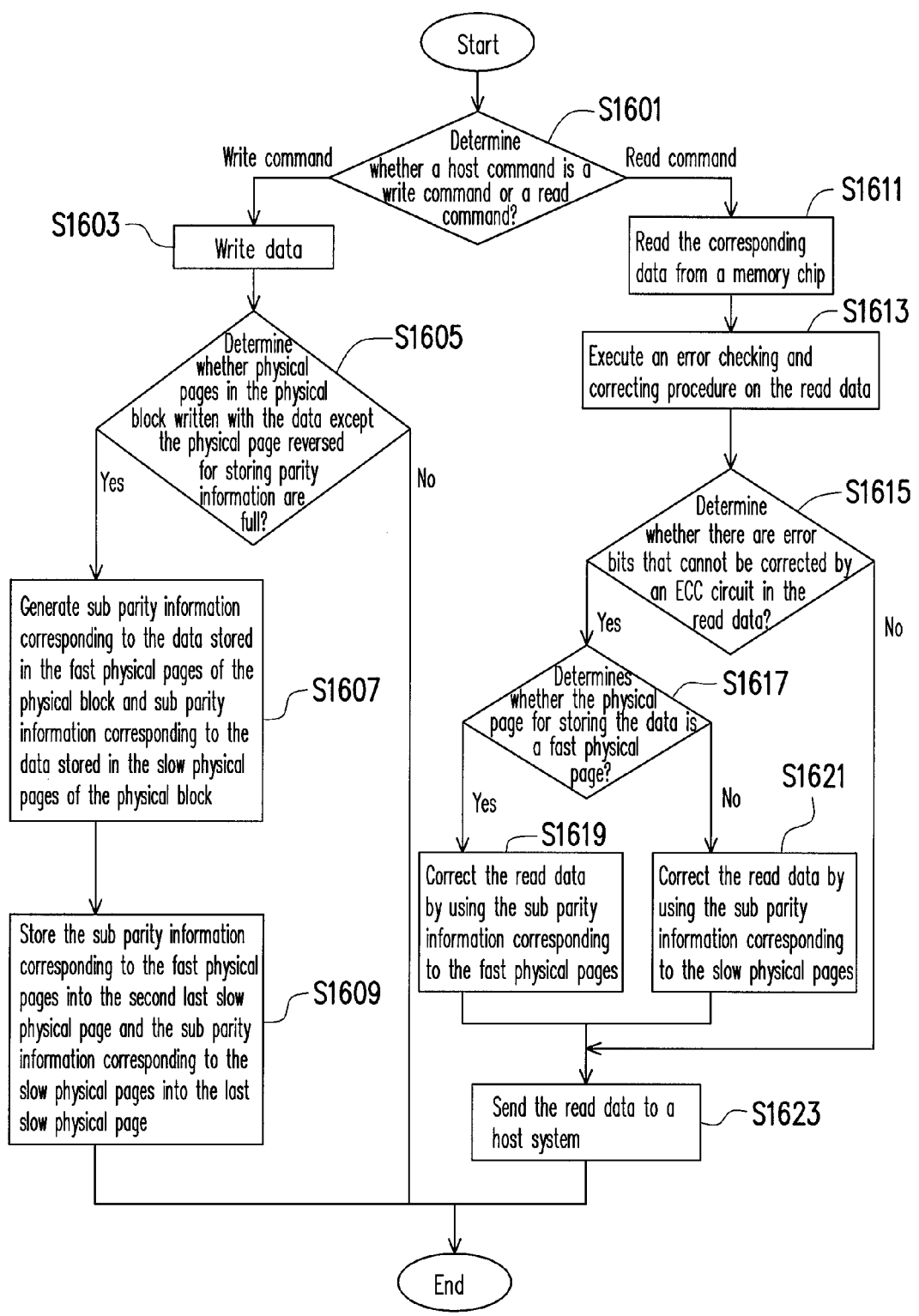
FIG. 16 is a flowchart of an error correcting method according to the third exemplary embodiment of the present invention.

FIG. 16 is a flowchart of an error correcting method according to the third exemplary embodiment of the present invention.

Referring to FIG. 16, when the memory storage apparatus 100 receives a host command from the host system 1000, in step S1601, the memory management circuit 202 determines whether the host command is a write command or a read command.

If the host command is a write command, in step S1603, the memory management circuit 202 writes data, and in step S1605, the memory management circuit 202 determines whether the physical pages in the physical block written with the data except the physical page for storing parity information are full. To be specific, in the present exemplary embodiment, the memory management circuit 202 reserves two physical pages for storing the sub parity information corresponding to the physical pages having two different write speeds. Additionally, in another exemplary embodiment wherein the memory chip is a 3-bit-per-cell flash memory, the memory management circuit 202 reserves three physical pages for storing the sub parity information corresponding to the physical pages having three different write speeds.

If the physical pages in the physical block written with the data except the physical page for storing the parity information are full, in step S1607, the memory management circuit 202 generates sub parity information corresponding to the data stored in the fast physical pages of the physical block and sub parity information corresponding to the data stored in the slow physical pages of the physical block. Next, in step S1609, the memory management circuit 202 stores the sub parity information corresponding to the fast physical pages into the second last slow physical page and stores the sub parity information corresponding to the slow physical pages into the last slow physical page. The procedure illustrated in FIG. 16 is terminated if the physical pages in the physical block written with the data except the physical page for storing the parity information are not full.

If the host command is a read command, in step S1611, the memory management circuit 202 reads the corresponding data from the memory chip 106. In step S1613, the ECC circuit 256 executes the error checking and correcting procedure on the read data.

Thereafter, in step S1615, the memory management circuit 202 determines whether there are error bits that cannot be corrected by the ECC circuit 256 in the read data.

If there are error bits that cannot be corrected by the ECC circuit 256 in the read data, in step S1617, the memory management circuit 202 determines whether the physical page for storing the read data is a fast physical page. If the physical page for storing the read data is a fast physical page, in step S1619, the memory management circuit 202 corrects the read data by using the sub parity information corresponding to the fast physical pages. If the physical page for storing the read data is not a fast physical page, in step S1621, the memory management circuit 202 corrects the read data by using the sub parity information corresponding to the slow physical pages. After that, in step S1623, the memory management circuit 202 sends the read data to the host system 1000.

Step S1623 is executed if there is no error bit that cannot be corrected by the ECC circuit 256 in the read data.

Fourth Exemplary Embodiment

The memory storage apparatus in the fourth exemplary embodiment is substantially the same as that in the first exemplary embodiment. Accordingly, only the differences between the two will be described. Below, the fourth exemplary embodiment will be described with reference to FIG. 2 and FIG. 3 of the first exemplary embodiment.

The memory management circuit 202 in the fourth exemplary embodiment also performs operations to the memory chip 106 according to the data access mechanism and the memory management mechanism illustrated in FIGS. 4-10.

In the present exemplary embodiment, each physical page can store a plurality of ECC frames. Besides, the memory management circuit 202 groups the ECC frames stored in a physical block into a plurality of ECC frame groups and generates sub parity information for each of the ECC frame groups. Namely, the ECC frames stored in one physical page respectively belong to one of the ECC frame groups, and the memory management circuit 202 generates the corresponding sub parity information in unit of ECC frame group.

FIG. 17 is a diagram illustrating the generation and storage of sub parity information according to the fourth exemplary embodiment of the present invention. For the convenience of description, it is assumed in the example illustrated in FIG. 17 that each physical block has 6 physical pages and each physical page has a capacity for storing 4 ECC frames. However, the present invention is not limited thereto, and in another exemplary embodiment of the present invention, each physical page has a capacity for storing 1, 2, or other suitable numbers of ECC frames.

Referring to FIG. 17, after the ECC frames EF1-EF20 are written into the $0^{th}$~$4^{th}$ physical pages of the physical block 304(D+1), the memory management circuit 202 groups the ECC frames EF1, EF5, EF9, EF13, and EF17 into an ECC frame group EFG1, the ECC frames EF2, EF6, EF10, EF14, and EF18 into an ECC frame group EFG2, the ECC frames EF3, EF7, EF11, EF15, and EF19 into an ECC frame group EFG3, and the ECC frames EF4, EF8, EF12, EF16, and EF20 into an ECC frame group EFG4. It has to be understood that the number of ECC frame groups is determined according to the number of ECC frames that can be stored in a physical page, and each ECC frame in each physical page is grouped into one of the ECC frame groups. However, the method of grouping the ECC frames is not limited to that illustrated in FIG. 17, and in another exemplary embodiment of the present invention, any technique for grouping the ECC frames in a physical block may be used as long as each ECC frame in each physical page can be grouped into one of the ECC frame groups.

In the present exemplary embodiment, the memory management circuit 202 respectively generates sub parity information GPI1, GPI2, GPI3, and GPI4 for the ECC frame groups EFG1, EFG2, EFG3, and EFG4 through XOR calculation and stores the sub parity information GPI1, GPI2, GPI3, and GPI4 into the $5^{th}$ physical page of the physical block 304(D+1). Herein the method of generating the sub parity information through XOR calculation is the same as that illustrated in FIG. 11 therefore will not be described herein.

Accordingly, when any error bit that cannot be corrected by the ECC circuit 256 occurs in the data stored in the physical pages of the physical block 304(D+1) (i.e., the data in the ECC frames), the memory management circuit 202 corrects the error bits by using the corresponding sub parity information. It should be mentioned that because each ECC frame group is corresponding to one sub parity information, the memory management circuit 202 can correct the error bits that cannot be corrected by the ECC circuit 256 in one ECC frame in each ECC frame group.

In the first exemplary embodiment, because the XOR calculation is executed on data in unit of physical pages to generate the parity information, the memory management circuit 202 can only correct the error bits occurred in one physical page in each physical block. However, in the present exemplary embodiment, because the XOR calculation is executed on data in unit of ECC frame group to generate the parity information, the memory management circuit 202 can correct the error bits occurred in multiple physical pages. For example, in the example illustrated in FIG. 17, if error bits that cannot be corrected by the ECC circuit 256 occurred in 4 ECC frames of a physical block and the 4 ECC frames are respectively stored into 4 different physical pages and belong to different ECC frame groups, the memory management circuit 202 is capable of correcting data in the 4 physical pages.

Figure 18:
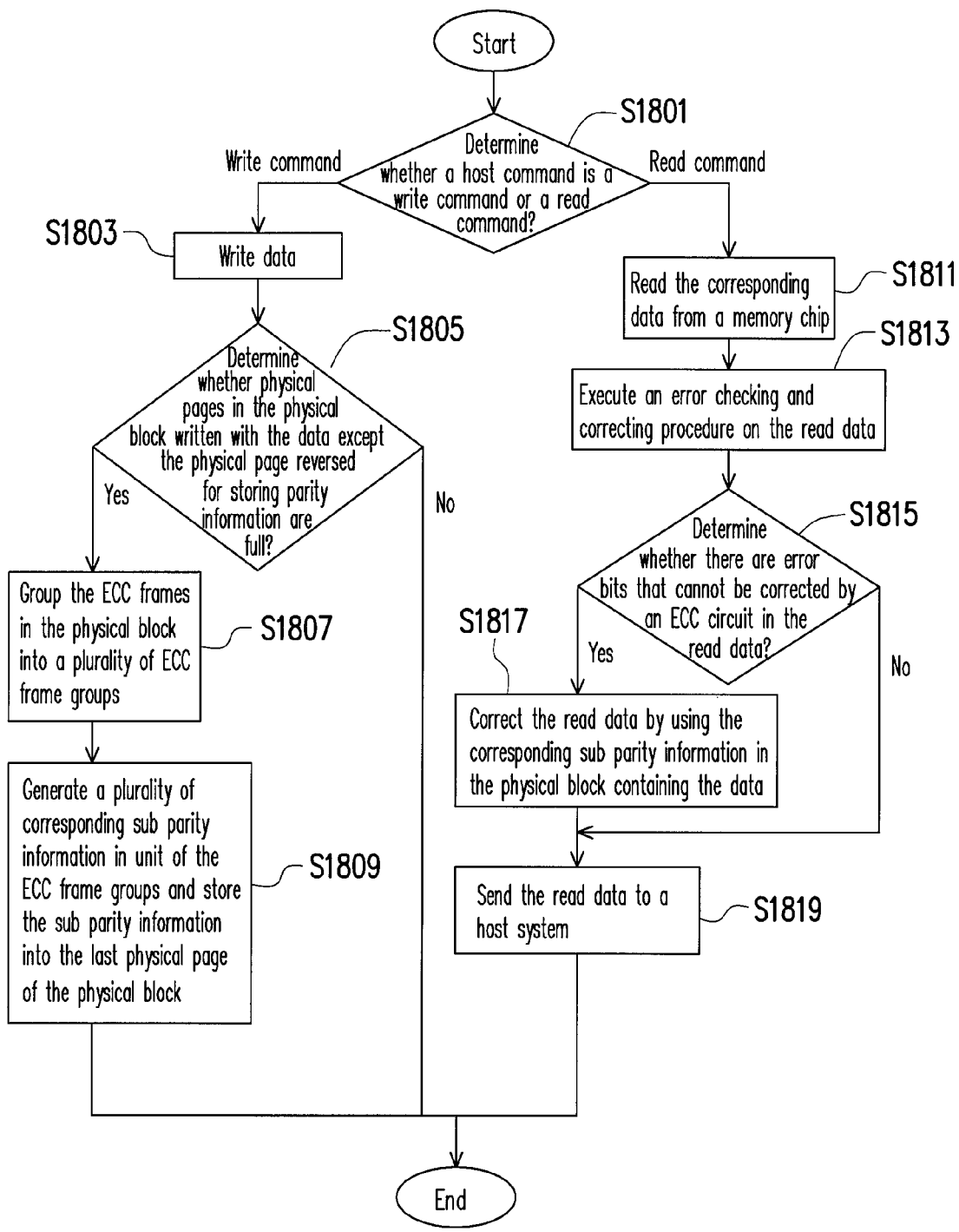
FIG. 18 is a flowchart of an error correcting method according to the fourth exemplary embodiment of the present invention.

FIG. 18 is a flowchart of an error correcting method according to the fourth exemplary embodiment of the present invention.

Referring to FIG. 18, when the memory storage apparatus 100 receives a host command from the host system 1000, in step S1801, the memory management circuit 202 determines whether the host command is a write command or a read command.

If the host command is a write command, in step S1803, the memory management circuit 202 writes data, and in step S1805, the memory management circuit 202 determines whether the physical pages in the physical block written with the data except the physical page reserved for storing parity information are full.

If the physical pages in the physical block written with the data except the physical page reserved for storing parity information are full, in step S1807, the memory management circuit 202 groups the ECC frames in the physical block into a plurality of ECC frame groups. Then, in step S1809, the memory management circuit 202 generates a plurality of corresponding sub parity information in unit of the ECC frame groups and stores the sub parity information into the last physical page of the physical block. The method of generating the parity information has been described in detail above therefore will not be described herein. The procedure illustrated in FIG. 18 is terminated if the physical pages in the physical block written with the data except the physical page reserved for storing parity information are not full.

If the host command is a read command, in step S1811, the memory management circuit 202 reads the corresponding data from the memory chip 106. In step S1813, the ECC circuit 256 executes the error checking and correcting procedure on the data.

Thereafter, in step S1815, the memory management circuit 202 determines whether there are error bits that cannot be corrected by the ECC circuit 256 in the read data.

If there are error bits that cannot be corrected by the ECC circuit 256 in the read data, in step S1817, the memory management circuit 202 corrects the read data by using the corresponding sub parity information in the physical block stored the read data. The method of correcting data with error bits by using sub parity information has been described in detail above therefore will not be described herein. After that, in step S1819, the memory management circuit 202 sends the read data to the host system 1000.

Step S1819 is executed if there is no error bit that cannot be corrected by the ECC circuit 256 in the read data.

As described above, in exemplary embodiments of the present invention, besides executing the error checking and correcting procedure on data stored in a physical block of the memory storage apparatus through the ECC circuit, parity information corresponding to the data in the physical block is further stored in the physical block through the memory management circuit. Thereby, the error correcting ability of the memory controller is further enhanced and accordingly data accuracy is further ensured. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An error correcting method, for a memory chip, wherein the memory chip has a plurality of physical blocks, each of the physical blocks has a plurality of physical pages, and the physical pages belonging to the same physical block are individually written and simultaneously erased, the error correcting method comprising:

generating a plurality of error checking and correcting (ECC) codes corresponding to a plurality of data, and sequentially writing the plurality of data and the ECC codes corresponding to the plurality of data into the physical pages of a first physical block among the physical blocks;

generating a first parity information according to the plurality of data;

writing the first parity information into one of the physical pages of the first physical block following the plurality of data;

correcting the plurality of data by using the ECC codes corresponding to the plurality of data; and correcting one of the plurality of data in the first physical block according to the first parity information when the one of the plurality of data cannot be corrected by using the ECC codes corresponding to the one of the plurality of data.

2. The error correcting method according to claim 1, wherein the step of generating the ECC codes corresponding to the plurality of data and sequentially writing the plurality of data and the ECC codes corresponding to the plurality of data into the physical pages of the first physical block comprises:

dividing the plurality of data into a plurality of frames;

generating an ECC code corresponding to each of the frames;

combining the frames and the ECC codes corresponding to the frames to generate a plurality of ECC frames, respectively; and writing the ECC frames into the physical pages of the first physical block.

3. The error correcting method according to claim 1, wherein the step of generating the first parity information according to the plurality of data comprises:

sequentially executing an XOR calculation according to each of the plurality of data to generate the first parity information.

4. The error correcting method according to claim 2, wherein the step of generating the first parity information according to the plurality of data comprises:
grouping the ECC frames into a plurality of ECC frame groups; and
generating a sub parity information corresponding to each of the ECC frame groups.

5. The error correcting method according to claim 1, wherein the number of bits corrected according to the first parity information is the same as the number of bits of the first parity information.

6. The error correcting method according to claim 1 further comprising:
generating a plurality of ECC codes corresponding to a plurality of other data, and sequentially writing the plurality of other data and the ECC codes corresponding to the plurality of other data into the physical pages of the first physical block;
generating a second parity information according to the plurality of other data;
writing the second parity information into one of the physical pages of the first physical block following the plurality of other data;
correcting the plurality of other data by using the ECC codes corresponding to the plurality of other data; and
correcting one of the plurality of other data in the first physical block according to the second parity information when the one of the plurality of other data cannot be corrected by using the ECC codes corresponding to the one of the plurality of other data.

7. The error correcting method according to claim 1, wherein the physical pages of the first physical block comprise a plurality of first physical pages and a plurality of second physical pages corresponding to the first physical pages, and a speed for writing data into the first physical pages is different from a speed for writing data into the second physical pages,
wherein the step of generating the first parity information according to the plurality of data comprises:
generating a first sub parity information for data written into the first physical pages; and
generating a second sub parity information for data written into the second physical pages,
wherein the step of writing the first parity information into one of the physical pages following the plurality of data comprises:
writing the first sub parity information into one of the second physical pages; and
writing the second sub parity information into one of the second physical pages.

8. The error correcting method according to claim 7, wherein the one of the second physical pages for writing the first sub parity information and the one of the second physical pages for writing the second sub parity information belong to different memory cells.

9. A memory controller, for managing a memory chip, wherein the memory chip has a plurality of physical blocks, each of the physical blocks has a plurality of physical pages, and the physical pages belonging to the same physical block are individually written and simultaneously erased, the memory controller comprising:
a host interface, configured for coupling to a host system;
a memory interface, configured for coupling to the memory chip; and
a memory management circuit, coupled to the host interface and the memory interface, and configured to:
generate a plurality of ECC codes corresponding to a plurality of data, and sequentially write the plurality of data and the ECC codes corresponding to the plurality of data into the physical pages of a first physical block among the physical blocks;
generate a first parity information according to the plurality of data;
write the first parity information into one of the physical pages of the first physical block following the plurality of data;
correct the plurality of data by using the corresponding ECC codes; and
correct one of the plurality of data in the first physical block according to the first parity information when the one of the plurality of data cannot be corrected by using the ECC codes corresponding to the one of the plurality of data.

10. The memory controller according to claim 9, wherein the process of generating the ECC codes corresponding to the plurality of data and sequentially writing the plurality of data and the ECC codes corresponding to the plurality of data into the physical pages of the first physical block executed by the memory management circuit comprises:
dividing the plurality of data into a plurality of frames;
generating an ECC code corresponding to each of the frames;
combining the frames and the ECC codes corresponding to the frames to generate a plurality of ECC frames, respectively; and
writing the ECC frames into the physical pages of the first physical block.

11. The memory controller according to claim 9, wherein the process of generating the first parity information according to the plurality of data executed by the memory management circuit comprises:
sequentially executing an XOR calculation according to each of the plurality of data to generate the first parity information.

12. The memory controller according to claim 10, wherein the process of generating the first parity information according to the plurality of data executed by the memory management circuit comprises:
grouping the ECC frames into a plurality of ECC frame groups; and
generating a sub parity information corresponding to each of the ECC frame groups.

13. The memory controller according to claim 9, wherein the number of bits corrected according to the first parity information is the same as the number of bits of the first parity information.

14. The memory controller according to claim 9, wherein the memory management circuit is further configured to:
generate a plurality of ECC codes corresponding to a plurality of other data, and sequentially write the plurality of other data and the ECC codes corresponding to the plurality of other data into the physical pages of the first physical block;
generate a second parity information according to the plurality of other data;
write the second parity information into one of the physical pages of the first physical block following the plurality of other data;
correct the plurality of other data by using the ECC codes corresponding to the plurality of other data; and
correct one of the plurality of other data in the first physical block according to the second parity information when the one of the plurality of other data cannot be corrected by using the ECC codes corresponding to the one of the plurality of other data.

15. The memory controller according to claim 9, wherein the physical pages of the first physical block comprise a plurality of first physical pages and a plurality of second physical pages corresponding to the first physical pages, and a speed for writing data into the first physical pages is different from a speed for writing data into the second physical pages, wherein the process of generating the first parity information according to the plurality of data executed by the memory management circuit comprises:

generating a first sub parity information for data written into the first physical pages; and generating a second sub parity information for data written into the second physical pages, wherein the process of writing the first parity information into one of the physical pages following the plurality of data executed by the memory management circuit comprises:

writing the first sub parity information into one of the second physical pages; and writing the second sub parity information into one of the second physical pages.

16. The memory controller according to claim 15, wherein the one of the second physical pages for writing the first sub parity information and the one of the second physical pages for writing the second sub parity information belong to different memory cells.

17. A memory storage system, comprising:

a connector;

a memory chip, having a plurality of physical blocks, wherein each of the physical blocks has a plurality of physical pages, and the physical pages belonging to the same physical block are individually written and simultaneously erased; and a memory controller, coupled to the memory chip and the connector, and configured to:

generate a plurality of ECC codes corresponding to a plurality of data, and sequentially write the plurality of data and the ECC codes corresponding to the plurality of data into the physical pages of a first physical block among the physical blocks;

generate a first parity information according to the plurality of data;

write the first parity information into one of the physical pages of the first physical block following the plurality of data;

correct the plurality of data by using the ECC codes corresponding to the plurality of data; and correct one of the plurality of data in the first physical block according to the first parity information when the one of the plurality of data cannot be corrected by using the ECC codes corresponding to the one of the plurality of data.

18. The memory storage system according to claim 17, wherein the process of generating the ECC codes corresponding to the plurality of data and sequentially writing the plurality of data and the ECC codes corresponding to the plurality of data into the physical pages of the first physical block executed by the memory controller comprises:

dividing the data into a plurality of frames;

generating an ECC code corresponding to each of the frames;

combining the frames and the ECC codes corresponding to the frames to generate a plurality of ECC frames, respectively; and writing the ECC frames into the physical pages of the first physical block.

19. The memory storage system according to claim 17, wherein the process of generating the first parity information according to the plurality of data executed by the memory controller comprises:

sequentially executing an XOR calculation according to each of the plurality of data to generate the first parity information.

20. The memory storage system according to claim 18, wherein the process of generating the first parity information according to the plurality of data executed by the memory controller comprises:

grouping the ECC frames into a plurality of ECC frame groups; and generating a sub parity information corresponding to each of the ECC frame groups.

21. The memory storage system according to claim 17, wherein the number of bits corrected according to the first parity information is the same as the number of bits of the first parity information.

22. The memory storage system according to claim 17, wherein the memory controller is further configured to:

generate a plurality of ECC codes corresponding to a plurality of other data, and sequentially write the plurality of other data and the ECC codes corresponding to the plurality of other data into the physical pages of the first physical block;

generate a second parity information according to the plurality of other data;

write the second parity information into one of the physical pages of the first physical block following the plurality of other data;

correct the plurality of other data by using the ECC codes corresponding to the plurality of other data; and correct one of the plurality of other data in the first physical block according to the second parity information when the one of the plurality of other data cannot be corrected by using the ECC codes corresponding to the one of the plurality of other data.

23. The memory storage system according to claim 17, wherein the physical pages of the first physical block comprise a plurality of first physical pages and a plurality of second physical pages corresponding to the first physical pages, and a speed for writing data into the first physical pages is different from a speed for writing data into the second physical pages, wherein the process of generating the first parity information according to the plurality of data executed by the memory controller comprises:

generating a first sub parity information for data written into the first physical pages; and generating a second sub parity information for data written into the second physical pages, wherein the process of writing the first parity information into one of the physical pages following the plurality of data executed by the memory controller comprises:
writing the first sub parity information into one of the second physical pages; and
writing the second sub parity information into one of the second physical pages.

24. The memory storage system according to claim 23, wherein the one of the second physical pages for writing the first sub parity information and the one of the second physical pages for writing the second sub parity information belong to different memory cells.

* * * * *